United States Patent
Okuda (10) Patent No.: US 9,065,471 B1
(45) Date of Patent: Jun. 23, 2015

(54) DELTA-SIGMA MODULATOR

(71) Applicant: RENESAS ELECTRONICS CORPORATION, Kanagawa (JP)

(72) Inventor: Takashi Okuda, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 0 days.

(21) Appl. No.: 14/548,377

(22) Filed: Nov. 20, 2014

(30) Foreign Application Priority Data

Dec. 17, 2013 (JP) .................................. 2013-259876

(51) Int. Cl.
*H03M 3/00* (2006.01)

(52) U.S. Cl.
CPC .............. *H03M 3/372* (2013.01); *H03M 3/416* (2013.01); *H03M 3/504* (2013.01)

(58) Field of Classification Search
CPC ....... H03M 3/30; H03M 3/372; H03M 3/416; H03M 3/504
USPC .................................................... 341/118, 143
See application file for complete search history.

(56) References Cited

U.S. PATENT DOCUMENTS

| | | | |
|---|---|---|---|
| 6,300,890 B1 * | 10/2001 | Okuda et al. .................. | 341/143 |
| 6,888,484 B2 * | 5/2005 | Kiss et al. ..................... | 341/143 |
| 6,922,161 B2 * | 7/2005 | Lee ................................ | 341/143 |
| 7,696,913 B2 * | 4/2010 | Melanson ...................... | 341/143 |
| 2011/0043398 A1 | 2/2011 | Hezar et al. | |

OTHER PUBLICATIONS

Hezar et al., "A 110dB SNR and 0.5mW Current-Steering Audio DAC Implemented in 45nm CMOS", Solid-State Circuits Conference Digest of Technical Papers (ISSCC), 2010 IEEE International, Feb. 7-11, 2010, pp. 304-305.

* cited by examiner

*Primary Examiner* — Khai M Nguyen
(74) *Attorney, Agent, or Firm* — Mattingly & Malur, PC (57) ABSTRACT

A delta-sigma modulator is configured to feedback an output signal of a quantizer to an input of an integrator, and also feedback to the input of the integrator a differentiated error signal representing derivative of quantization error caused by the quantizer.

20 Claims, 10 Drawing Sheets

Fig. 10B

DELTA-SIGMA MODULATOR

CROSS-REFERENCE TO RELATED APPLICATIONS

This application is based upon and claims the benefit of priority from Japanese patent application No. 2013-259876, filed on Dec. 17, 2013, the disclosure of which is incorporated herein in its entirety by reference.

BACKGROUND

A delta-sigma modulator is widely used in analog-to-digital converters (ADCs) and digital-to-analog converters (DACs). In this specification, an ADC which uses delta-sigma modulation and a DAC which uses delta-sigma modulation are referred to as a delta-sigma ADC and a delta-sigma DAC, respectively. A delta-sigma modulator may be called a sigma-delta modulator. A delta-sigma modulator can spread quantization error (or quantization noise) power to an oversampling frequency fosr by oversampling. A delta-sigma modulator also can shift quantization noise to a higher frequency domain owing to noise shaping characteristics thereof, thereby suppressing quantization noise in the frequency band of interest (typically, a frequency band lower than the Nyquist frequency).

However, continuous-time delta-sigma modulators and continuous-time delta-sigma DACs are known to have low clock jitter tolerance. This is because the noise transfer function (NTF) of a delta-sigma modulator has a peak at half the oversampling frequency fosr (i.e., fosr/2). Since the out-of-band quantization noise (in particular, the quantization noise near fosr/2) is folded back into the frequency band of interest due to interference caused by clock jitter, the noise characteristics of the delta-sigma modulator are degraded.

Hezar et al., "A 110 dB SNR and 0.5 mW Current-Steering Audio DAC Implemented in 45 nm CMOS", Solid-State Circuits Conference Digest of Technical Papers (ISSCC), 2010 IEEE International, pp 304-305, 7-11 Feb. 2010 (hereinafter "Hezar et al.") and U.S. Patent Application Publication No. 2011/0043398, filed by Hezar et al., entitled "Cascaded DAC Architecture with Pulse Width Modulation" (hereinafter "U.S. Patent Application Publication No. 2011/0043398") disclose delta-sigma DACs including an analog finite impulse response (AFIR) filter DAC which is coupled to the output of a delta-sigma modulator (i.e., noise shaping circuit) (see FIGS. 16.7.2 and 16.7.3 of Hezar et al. and FIGS. 6, 7 and 9 of U.S. Patent Application Publication No. 2011/0043398). The AFIR filter DAC has an AFIR filter, and each tap of this AFIR filter includes a multi-bit or 1-bit DAC. Typically, a DAC disposed on each tap is a current-steering DAC. The analog outputs of the multiple DACs are summed up to form an analog output signal. That is, the DACs disclosed in Hezar et al. and U.S. Patent Application Publication No. 2011/0043398 are configured to calculate a moving sum of the output of the delta-sigma modulator in the AFIR filter DAC. This configuration can suppress the out-of-band quantization noise (see paragraphs 0030 and 0031 and FIG. 6 of U.S. Patent Application Publication No. 2011/0043398). Thus, it is possible to reduce the degradation of noise characteristics caused when the out-of-band quantization noise is folded back into the frequency band of interest due to interference caused by clock jitter.

As described above, the delta-sigma DACs disclosed in Hezar et al. and Patent Application Publication No. 2011/0043398 are configured to calculate a moving sum of the output of the delta-sigma modulator in the AFIR filter DAC which is coupled to the output of the delta-sigma modulator. This configuration requires the same number of DACs as the number of taps of the AFIR filter. However, disposition of many DACs unfavorably increases the circuit size. For a delta-sigma DAC, it may calculate a moving sum of the output of the delta-sigma modulator in the digital domain rather than in the analog domain. However, digital calculation of a moving sum refers to digital addition and therefore the bit number of a digital signal is increased after the moving sum is calculated. This increases the number of devices of analog circuits including DACs. Further, a dynamic element matching (DEM) circuit may be required for correcting mismatch of the analog circuit. In this case, an additional logic circuit may be required.

For a delta-sigma ADC, a moving sum of the output of the delta-sigma modulator can be calculated in the digital domain. Typically, one DAC is disposed on a feedback path in the delta-sigma modulator to feed back the output signal of the quantizer. If a delta-sigma ADC employs a configuration where a moving sum of the output of the delta-sigma modulator is fed back to the input of an integrator in the delta-sigma modulator, multiple DACs must be disposed on the feedback path. This may increase the circuit size.

On the other hand, if a delta-sigma ADC employs a configuration where the output of the quantizer prior to calculating a moving sum is fed back to the input of the integrator, any increase in the circuit size resulting from the disposition of many feedback DACs on the feedback path does not occur. However, this configuration fails to filter the quantization noise which is fed back from the output of the quantizer to the input of the integrator. For this reason, this configuration may not sufficiently suppress the degradation of noise characteristics caused when the out-of-band quantization noise is folded back into the frequency band of interest.

SUMMARY

As is understood from the above description, the configuration where a moving sum of the output of the delta-sigma modulator is calculated, as disclosed in Hezar et al. and U.S. Patent Application Publication No. 2011/0043398, has a first problem that this configuration requires more DACs than those in the configuration where no moving sum is calculated and thus may increase the circuit sizes of the delta-sigma DAC and delta-sigma ADC. This configuration also has a second problem that it may not sufficiently reduce the degradation of noise characteristics in the delta-sigma ADC.

Hereafter, there will be described multiple embodiments which can contribute to solution of at least one of multiple problems including the above-mentioned first and second problems. Other problems and novel features will be apparent from the description of the present specification and the accompanying drawings.

In one embodiment, a delta-sigma modulator is configured, to feedback an output signal of a quantizer to an input of an integrator, and also feedback to the input of the integrator a differentiated error signal representing derivative of quantization error caused by the quantizer.

In another embodiment, a delta-sigma modulator has following characteristics. That is, in characteristics obtained by plotting an output signal of a quantization block as a function of frequency, a value of quantization error component at half the oversampling frequency fosr (i.e., fosr/2) is smaller than the largest value of quantization error component within a frequency band lower than fosr/2 (i.e., 0 or larger and smaller than fosr/2).

The above-described embodiments can contribute to solving at least one of the problems mentioned above.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Now, specific embodiments will be described in detail with reference to the accompanying drawings. The same or corresponding components or elements are given the same reference signs throughout the drawings, and repeated description thereof will be omitted as necessary to clarify the description.

Comparative Example

Figure 9:
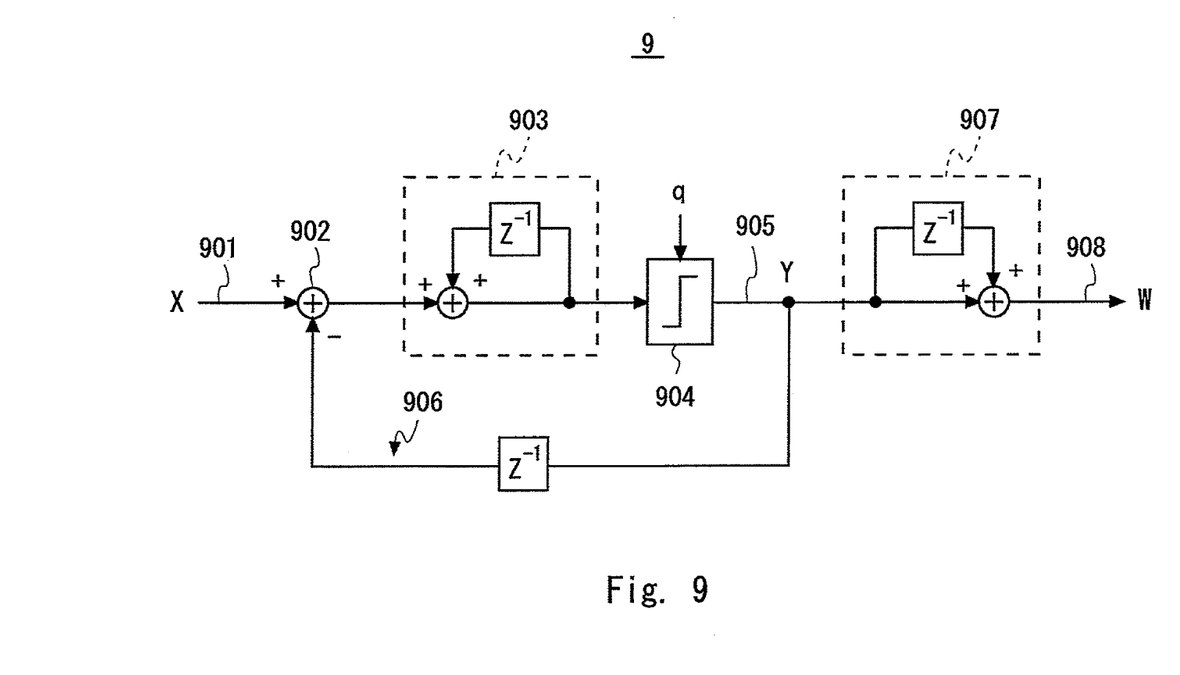
FIG. 9 is a diagram showing an example configuration of a delta-sigma modulator according to a comparative example.

To begin with, a delta-sigma modulator according to a comparative example will be described. FIG. 9 shows an example configuration of a delta-sigma modulator 9 according to a comparative example. An integrator 903, a quantizer 904 and a feedback path 906 form a primary first-order delta-sigma modulator. The feedback path 906 provides an output signal 905 of the quantizer 904 to an input of the integrator 903. The integrator 903 integrates a signal obtained by subtracting the output signal 905 of the quantizer 904 from an input signal 901. In the example configuration of FIG. 9, an adder 902 subtracts the output signal 905 from the input signal 901. A moving sum block 907 calculates a moving sum of an output signal of the quantizer 904 (that is, an output signal of the first-order delta-sigma modulation). The moving sum may be calculated in the digital domain by a digital signal processor (DSP), microprocessor, or the like. Alternatively, the moving sum may be calculated in the analog domain by the AFIR filter DAC described in Hezar et al. or U.S. Patent Application Publication No. 2011/0043398.

As well known, the relationship between the input signal 901 (X) and the output signal 905 (Y) of the quantizer 904 is represented by Formula (1) below:

$$Y = X + (1-Z^{-1})q \qquad (1)$$

where q represents quantization error (or quantization noise) caused by the quantizer 904. That is, the quantization error q is noise-shaped by a first-order high-pass filter factor which is expressed as $(1-Z^{-1})$ in Z transform representation.

On the other hand, the relationship between the input signal 901 (X) and an output signal 908 (W) of the moving sum block 907 is represented by Formula (2) below.

$$W = (1+Z^{-1})X + (1+Z^{-1})(1-Z^{-1})q \qquad (2)$$

Owing to the effect of the moving sum, the quantization error q is filtered by a first-order low-pass filter factor which is expressed as $(1+Z^{-1})$ in Z transform representation. As a result, the quantization error q becomes zero at half the oversampling frequency Fosr (i.e., fosr/2).

Figure 10A:
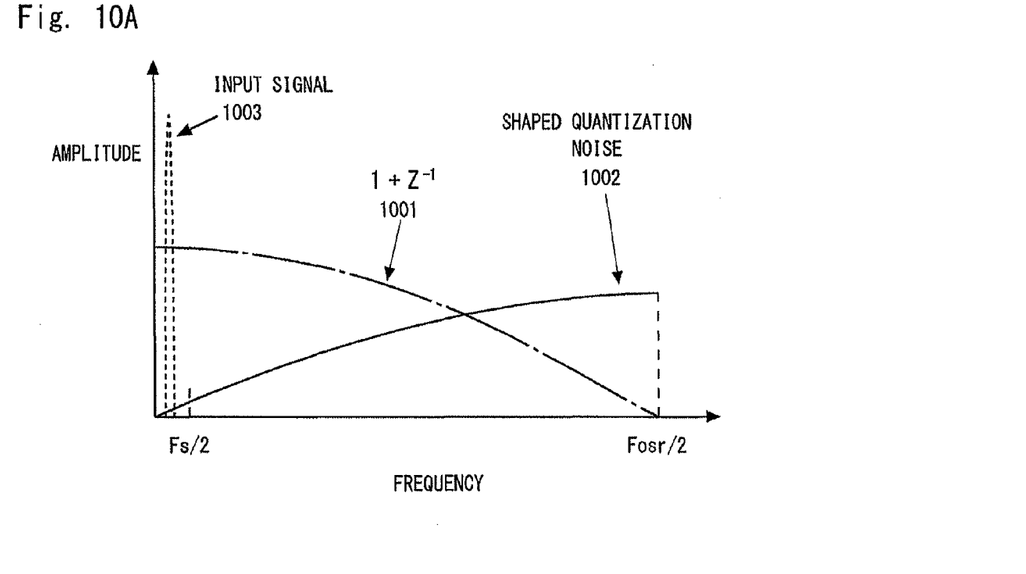
FIG. 10A is a diagram showing noise shaping characteristics of a delta-sigma modulator.

A solid line 1002 shown in FIG. 10A is obtained by plotting, as a function of frequency, the quantization error (or quantization noise) that has been noise-shaped by first-order delta-sigma modulation. That is the solid line 1002 represents the quantization noise included in the output signal 905 (Y) of the quantizer 904 (i.e., $(1-Z^{-1})q$ in Z transform representation). On the other hand, an alternate long and short dashed line 1001 shown in FIG. 10A represents a first-order low-pass filter function $(1+Z^{-1})$ obtained by the moving sum block 907. A dotted line 1003 shown in FIG. 10A represents the spectrum of the input signal 901 (X) provided to the delta-sigma modulator 9.

Figure 10B:
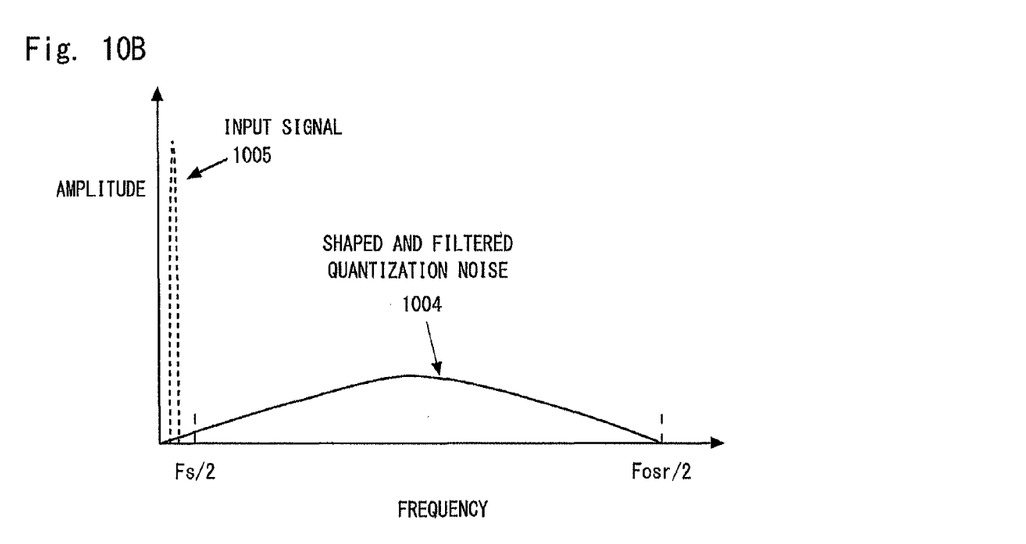
FIG. 10B is a diagram showing an effect of low-pass filtering quantization noise obtained by calculating a moving sum of output signals of a delta-sigma modulator.

FIG. 10B represents the spectrum of the output signal 908 (W) of the delta-sigma modulator 9. The output signal 908 (W) includes an input signal component and a quantization error (or quantization noise) component. A solid line 1004 shown in FIG. 10B is obtained by plotting, as a function of frequency, a quantization noise component to which a low-pass filter effect produced by the moving sum block 907 (i.e., $(1+Z^{-1})$) has been further applied. That is, the solid line 1004 represents a quantization noise component included in the output signal 908 (W) of the moving sum block 907. A dotted line 1005 shown in FIG. 10B represents the spectrum of an input signal component included in the output signal 908 (W) of the delta-sigma modulator 9 (in other words, the output signal of the moving sum block 907). As is understood from FIG. 10B, calculation of a moving sum of the output signal 905 (Y) of the quantizer 904 allows reduction of the out-of-band quantization noise (in particular, the quantization noise near fosr/2). Specifically, in FIG. 10B, a value of the quantization noise component at half the oversampling frequency fosr (i.e., fosr/2) is smaller than the largest value of the quantization noise component within a frequency band lower than fosr/2 (i.e., 0 or larger and smaller than fosr/2). More specifically, it is ideal that a value of the quantization noise component at fosr/2 be zero in FIG. 10B. However, when the delta-sigma modulator 9 is actually used or evaluated, a value of the quantization noise component at fosr/2 do not necessarily become zero due to such as the influence of external noise caused by an evaluation system device or peripheral device or operation noise caused by other ICs on the chip. Nevertheless, a value of the quantization noise component at half the oversampling frequency fosr (i.e., fosr/2) is at least smaller than the largest value of the quantization noise component within a frequency band lower than fosr/2 (i.e., 0 or larger and smaller than fosr/2).

The delta-sigma modulator 9 shown in FIG. 9, however, requires more DACs than does the configuration without the use of the moving sum block 907, and therefore the circuit size thereof may increase. For example, if being used as a delta-sigma DAC, the delta-sigma modulator 9 requires the same number of DACs as the number of taps of the AFIR filter, as with the AFIR filter DACs described in Hezar et al. and U.S. Patent Application Publication No. 2011/0043398. Further, when the moving sum block 907 performs digital calculation, the bit number (e.g., 2 bits) of the output signal 908 of the moving sum block 907 becomes larger than the bit number (e.g., 1 bit) of the output signal 905 of the quantizer 904. Accordingly, the configuration shown in FIG. 9 increases the number of devices of analog circuits including DACs.

On the other hand, if the delta-sigma modulator 9 is used as a delta-sigma ADC, the moving sum block 907 cannot filter the quantization error (or quantization noise) fed back from the output of the quantizer 904 to the input of the integrator 903. For this reason, the configuration shown in FIG. 9 may not sufficiently suppress the degradation of noise characteristics caused when the out-of-band quantization noise is folded back into the frequency band of interest.

Embodiments described below provide improvements for addressing at least one of multiple problems including those described above.

First Embodiment

Figure 1:
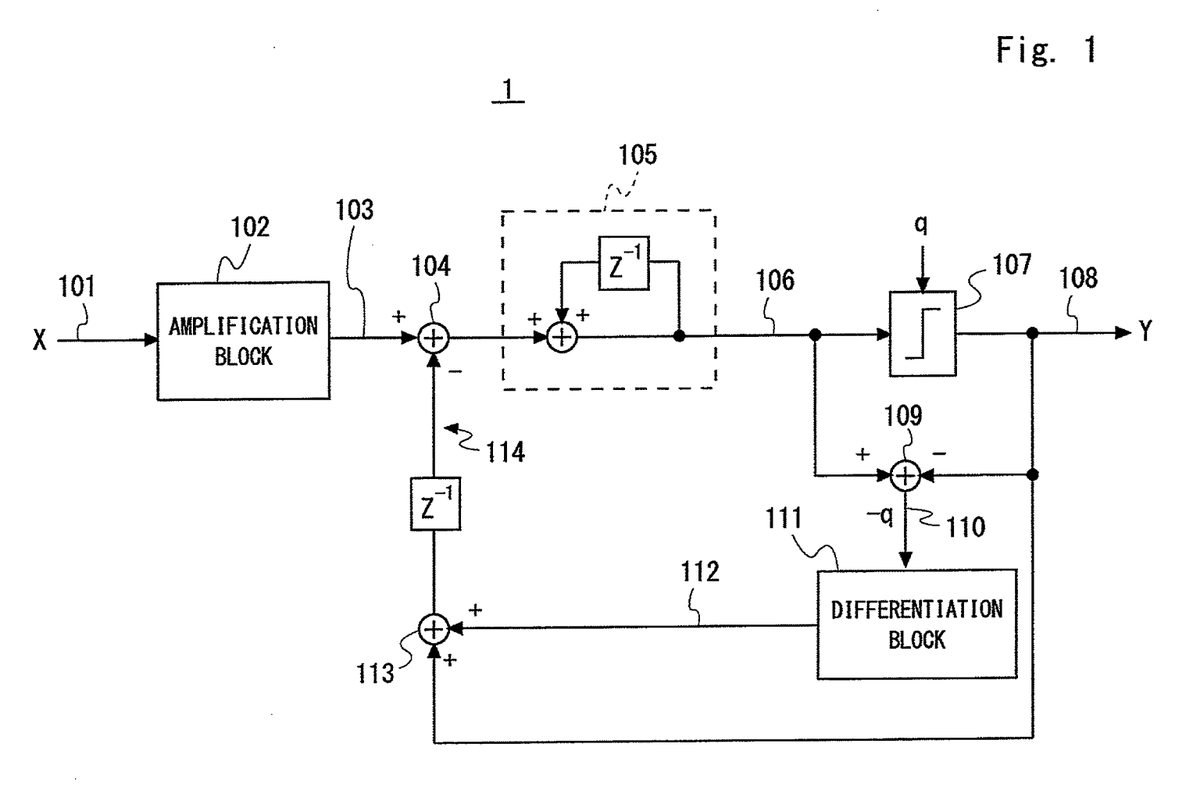
FIG. 1 is a diagram showing an example configuration of a delta-sigma modulator according to a first embodiment.

FIG. 1 shows an example configuration of a delta-sigma modulator 1 according to the present embodiment. In the example configuration shown in FIG. 1, the delta-sigma modulator 1 includes an integrator 105, a quantizer 107 and a feedback path 114 for providing the output signal of the quantizer 107 to the input of the integrator 105 and is configured to perform first-order delta-sigma modulation. The delta-sigma modulator 1 is also configured to feedback, to the input of the integrator 105, a differentiated error signal 112 representing derivative of quantization error (or quantization noise) q caused by the quantizer 107. Hereafter, the configuration and operation of the delta-sigma modulator 1 shown in FIG. 1 will be described in detail.

The integrator 105 includes one integration stage and integrates a signal provided by an adder 104. The adder 104 subtracts a feedback signal provided by the feedback path 114 from a signal 103. The signal 103 is generated by an amplification block 102. The amplification block 102 amplifies the amplitude of an input signal 101 provided to the delta-sigma modulator 1. Details of the amplification block 102 will be described later. Note that the amplification block 102 may be omitted.

The quantizer 107 quantizes an integrated signal 106 generated by the integrator 105. An output signal 108 of the quantizer 107 is an output signal (Y) of the delta-sigma modulator 1.

The feedback path 114 provides the output signal 108 of the quantizer 107 to the input of the integrator 105 through the adder 104. Further, the feedback path 114 is coupled to a differentiation block 111. The differentiation block 111 generates the differentiated error signal 112 representing the derivative of the quantization error q caused by the quantizer 107. In the example of FIG. 1, an adder 109 generates a signal 110 (i.e., −q) whose sign is inverse to that of the quantization error q by subtracting the output signal 108 of the quantizer 107 from the integrated signal 106 generated by the integrator 105 (i.e., the input signal of the quantizer 107). The differentiation block 111 generates the differentiated error signal 112 by differentiating the signal 110.

The differentiation block 111 only has to include the same number of differentiation stages as the number of integration stages included in the integrator 105. In other words, if the integrator 105 includes n number of integration stages, the differentiation block 111 only has to calculate the n-order derivative of the quantization error. As used herein, n is an integer greater than or equal to 1. Since the integrator 105 includes one integration stage in the example configuration of FIG. 1, which is related to first-order delta-sigma modulation, the differentiation block 111 only has to calculate the first order derivative of the quantization error.

The differentiated error signal 112 is combined with the feedback signal (i.e., the output signal 108 (Y) of the delta-sigma modulator 1) by an adder 113 and then fed back to the input of the integrator 105 through the feedback path 114 and the adder 104. In other words, the feedback path 114 provides the feedback signal including both the output signal 108 (Y) and the differentiated error signal 112 to the integrator 105. The feedback signal may be obtained by adding the differentiated error signal 112 to the output signal 108 (Y), as shown in FIG. 1; alternatively, it may be obtained by subtracting the differentiation error signal 112 from the output signal 108 (Y). Whether to perform addition or subtraction between the output signal 108 (Y) and the differentiated error signal 112 may be determined depending on the definition of the positive or negative sign of the quantization error and details of the calculation in the differentiation block 111, or may be determined in such a manner that a formula representing the relationship between the output signal 108 (Y) and the input signal 101 (X) (i.e., Formula (3); to be discussed later) is satisfied.

The use of the configuration where the differentiated error signal 112 is fed back to the input of the integrator 105 may increase the quantization noise power in the frequency band of interest. The amplification block 102 is disposed to compensate for the degradation of the signal-to-noise ratio (SNR) resulting from such an increase in the quantization noise power. The gain of the amplification block 102 may be determined based on the gain of the quantization noise power in the frequency band of interest resulting from the feedback of the differentiated error signal 112. However, as described above, the amplification block 102 may be omitted. This is because the quantization noise power in the frequency band of interest is sufficiently suppressed owing to the noise shaping effects of delta-sigma modulation. Accordingly, even when the quantization noise power in the frequency band of interest increases due to feedback of the differentiated error signal 112, the SNR can be sufficiently high. In this case, the amplification block 102 is not necessarily required. Particularly, if the delta-sigma modulator 1 shown in FIG. 1 is used in a delta-sigma ADC, the amplification block 102 is composed of an analog amplifier circuit. For this reason, whether to use the amplification block 102 may be determined based on a comparison between the noise figure of the analog amplifier circuit and the degree of SNR degradation resulting from the feedback of the differentiated error signal.

Figure 2:
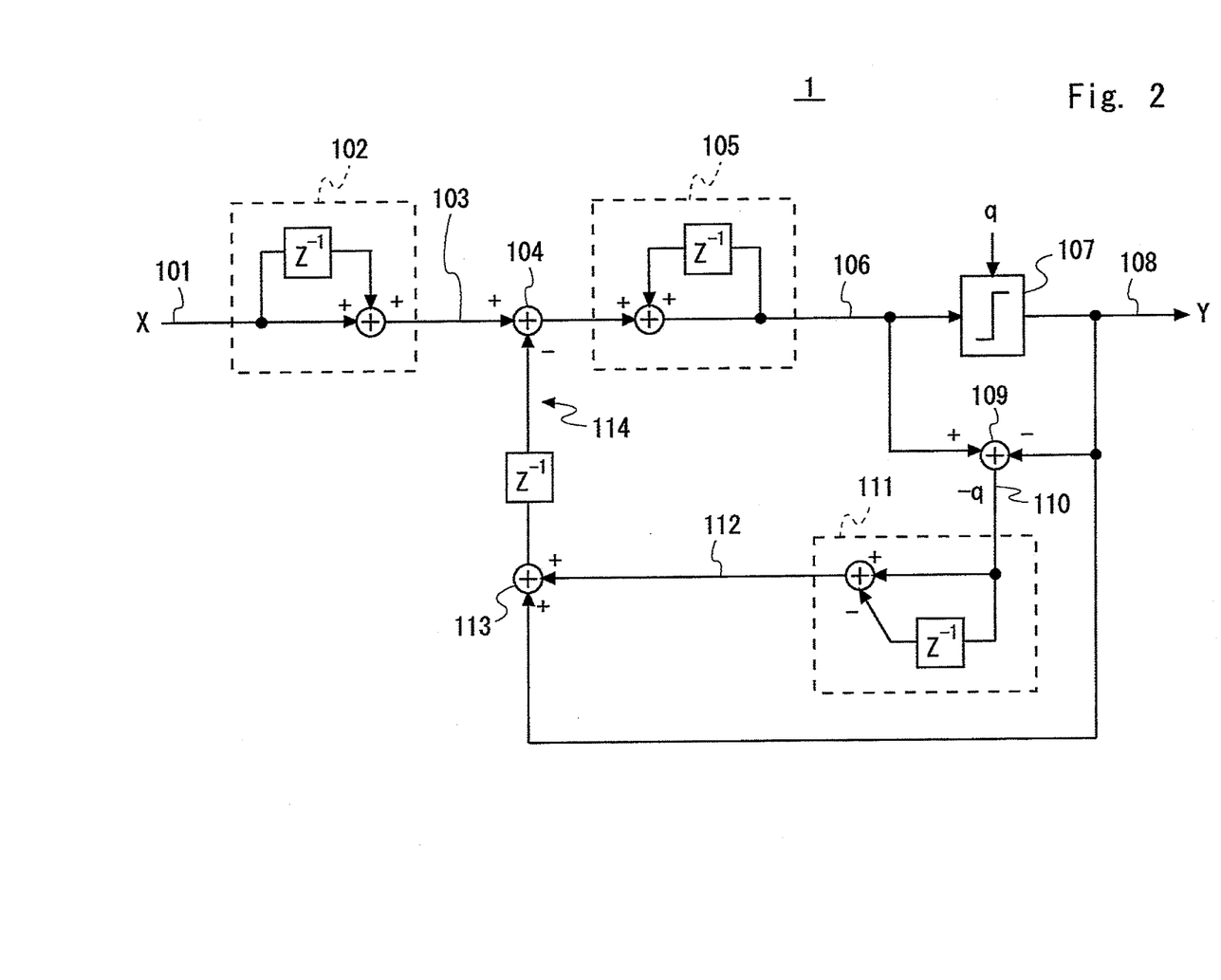
FIG. 2 is a diagram showing an example configuration of a delta-sigma modulator according to the first embodiment.

FIG. 2 shows a more specific example configuration of the delta-sigma modulator 1 shown in FIG. 1. The amplification block 102 shown in FIG. 2 adds, to the input signal 101, a signal obtained by delaying the input signal 101. That is, the amplification block 102 shown in FIG. 2 calculates a moving sum of the input signal 101 (i.e., $(1+Z^{-1})$ in Z transform representation). The differentiation block 111 shown in FIG. 2 includes one differentiation stage (i.e., $(1-Z^{-1})$ in Z transform representation). The relationship between the output signal 108 (Y) and input signal 101 (X) of the delta-sigma modulator 1 shown in FIG. 2 is mathematically represented by Formula (3) below.

$$Y = \{(1+Z^{-1})X - Z^{-1}Y + Z^{-1}(1-Z^{-1})q\}\frac{1}{(1-Z^{-1})} + q \quad (3)$$
$$= (1+Z^{-1})X + (1+Z^{-1})(1-Z^{-1})q$$

Note that the noise transfer function (NTF) with respect to the quantization error q shown on the right side of Formula (3), that is, $(1+Z^{-1})(1-Z^{-1})$ is the same as that on the right side of Formula (2). Also note that while the left side of Formula (2) represents the output signal 908 (W) of the moving sum block 907, the left side of Formula (3) represents the output signal 108 (Y) of the quantizer 107. That is, the delta-sigma modulator 1 shown in FIGS. 1 and 2 is configured to feedback to the input of the integrator 105 the differentiated error signal 112, which represents the derivative of the quantization noise q caused by the quantizer 107, as well as the output signal 108 (Y) of the quantizer 107. Owing to this configuration, the delta-sigma modulator 1 can filter the quantization error (or quantization noise) q with a low-pass filter factor $(1+Z^{-1})$ equivalent to that obtained by the moving sum block 907 of FIG. 9 as shown in Formula (3), thereby reducing the out-of-band quantization noise (in particular, the quantization noise near fosr/2).

Further, the delta-sigma modulator 1 provides the improved NTF, i.e., $(1+Z^{-1})(1-Z^{-1})$ through the calculation in the feedback loop thereof. This prevents an increase in the bit number of the output signal 108 (Y) of the delta-sigma modulator 1. That is, if the quantizer 107 is a 1-bit quantizer, the bit number of the output signal 108 (Y) remains one bit. Thus, the delta-sigma modulator 1 can solve some problems associated with the configuration including the moving sum block 907 shown in FIG. 9, for example, an increase in the bit number of the modulator output, an increase in the number of DACs to be disposed at outputs of the modulator, and an increase in the number of feedback DACs.

Further, it should be noted that the signal transfer function (STF) with respect to the input signal 101 (X) shown on the right side of Formula (3), i.e., $(1+Z^{-1})$ is the same as that on the right side of Formula (2). That is, the delta-sigma modulator 1 shown in FIGS. 1 and 2 is configured to amplify the input signal 101 (X) in the amplification block 102. The amplification of the input signal 101 (X) may be performed by calculating a moving sum of the input signal 101 (X). Owing to the configuration including the amplification block 102, the input signal 101 (X) is given a gain which is equivalent to that given to the quantization error q by a filter factor expressed as $(1+Z^{-1})$ in Z transform representation. For this reason, the configuration including the amplification block 102 may contribute to suppressing SNR degradation. However, as described above, the amplification block 102 may be omitted. That is, a main objective of the delta-sigma modulator 1 is to add a low-pass filter factor (e.g., $(1+Z^{-1})$) to the NTF rather than to make the transfer function of the delta-sigma modulator 1 including the STF and NTF equal to that in Formula (2). Accordingly, the amplification block 102 may be omitted or modified. For example, the amplification block 102 may double the amplitude of the input signal 101 (X). Further, the configuration of the differentiation block 111 or the calculation in the differentiation block 111 is not limited to that shown in FIG. 2.

Second Embodiment

Figure 3:
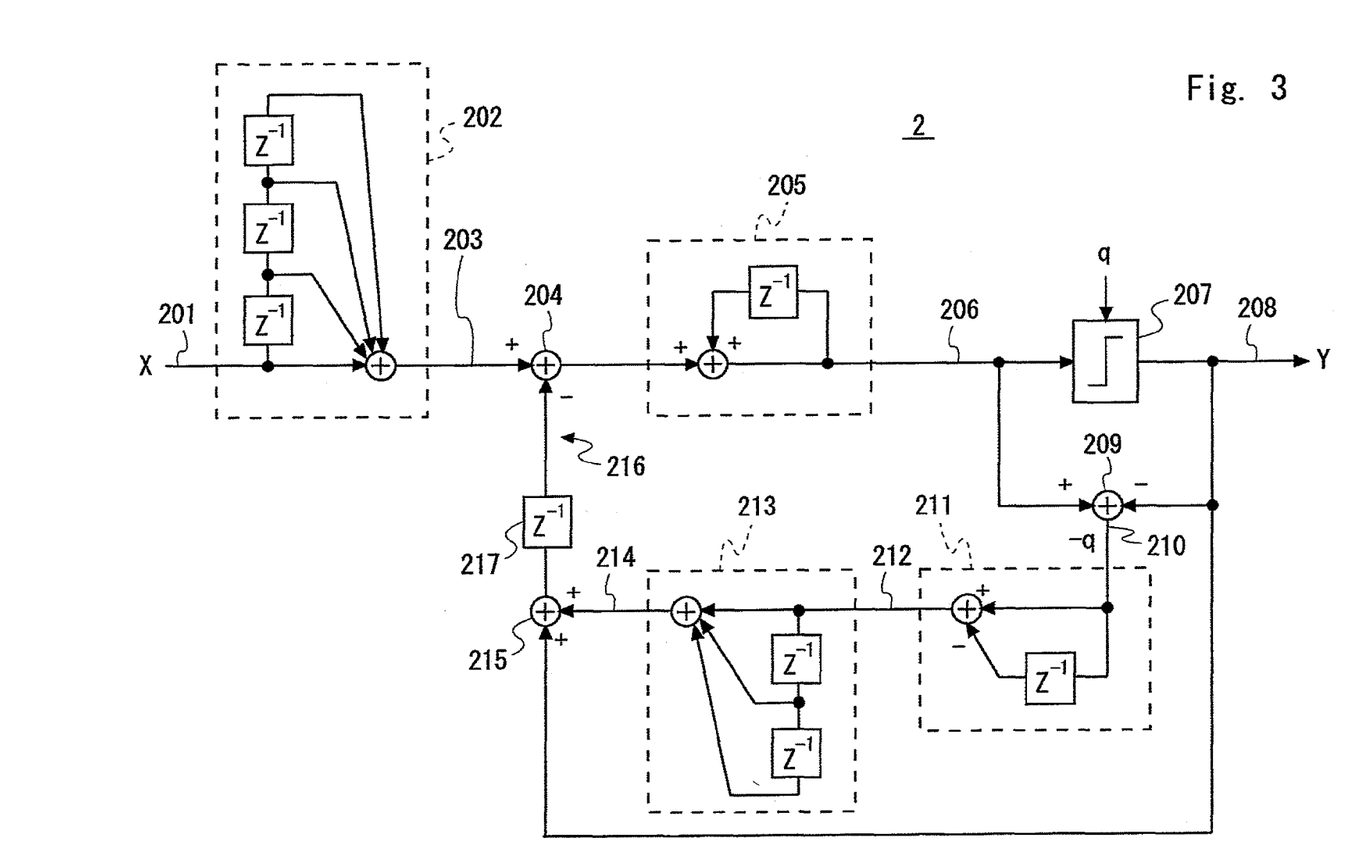
FIG. 3 is a diagram showing an example configuration of a delta-sigma modulator according to a second embodiment.

In the present embodiment, a modification of the delta-sigma modulator 1 according to the first embodiment will be described. FIG. 3 shows an example configuration of a delta-sigma modulator 2 according to the present embodiment. The delta-sigma modulator 2 has basically the same configuration as the delta-sigma modulator 1 shown in FIGS. 1 and 2. The different therebetween is that the delta-sigma modulator 2 includes a smoothing block 213 for smoothing a differentiated error signal 212 generated by a differentiation block 211 and is configured to feedback, to the input of an integrator 205, a smoothed differentiated error signal 214 as well as an output signal 208 (Y) of a quantizer 207. Hereafter, the configuration and operation of the delta-sigma modulator 2 shown in FIG. 3 will be described in detail.

An amplification block 202 amplifies the amplitude of an input signal 201 (X) of the delta-sigma modulator 2. In the example of FIG. 3, assume that the amplification block 202 is a four-tap finite impulse response (FIR) filter for calculating a moving sum of the input signal 201 (X). However, the configuration of the amplification block 202 or the calculation in the amplification block 202 is not limited to that shown in FIG. 3. Further, the amplification block 202 may be omitted.

The configurations and operations of an adder 204, an integrator 205, a quantizer 207, an adder 209 and a differentiation block 211 may be substantially the same as those of the adder 104, the integrator 105, the quantizer 107, the adder 109 and the differentiation block 111 shown in FIG. 1 or 2. In short, the adder 204 subtracts a feedback signal provided by the feedback path 216 from a signal 203. The integrator 205 integrates a signal provided by the adder 204. The quantizer 207 quantizes an integrated signal 206 generated by the integrator 205. The adder 209 generates a signal 210 (i.e., −q) where the sign of the quantization error q is inverted, by subtracting an output signal 208 (Y) of the quantizer 207 from the integrated signal 206 generated by the integrator 205. The differentiation block 211 generates a differentiated error signal 212 by differentiating the signal 210.

The smoothing block 213 is coupled to the feedback path 216 and the differentiation block 211 and configured to smooth the differentiated error signal 212 generated by the differentiation block 211. The smoothing block 213 may have an FIR filter configuration as shown in FIG. 3. The smoothing block 213 may also calculate a moving sum or moving average of the differentiated error signal 212. In other words, the smoothed differentiated error signal 214 may represent a moving sum or moving average of the differentiated error signal 212. In the example of FIG. 3, the smoothing block 213 includes a three-tap FIR filter for calculating a moving sum of a differentiated error signal 212. If the delta-sigma modulator 2 is used as a delta-sigma DAC, the configuration of the smoothing block 213 shown in FIG. 3 can be easily implemented using cascaded flip-flop circuits. The smoothed differentiated error signal 214 by the smoothing block 213 is combined with the feedback signal (i.e., the output signal 208 (Y) of the delta-sigma modulator 2) by an adder 215 and then provided to the input of the integrator 205 through the feedback path 216 and the adder 204.

Note that the order (or length) of the FIR filter included in the smoothing block 213 is not an arbitrary order (or length). In order to achieve the objective of suppressing the quantization noise near fosr/2, the order of a low-pass filter factor given to the noise transfer function (NTF) of the quantization error q by the differentiation block 211, the smoothing block 213 and the feedback path 216 must be odd. In other words, the low-pass filter factor given to the noise transfer function (NTF) of the quantization error q by the differentiation block 211, the smoothing block 213 and the feedback path 216 must be represented by Formula (4) below in Z transform representation.

$$\text{LPF Factor} = \sum_{n=0}^{2m+1} h(n)Z^{-n} \quad m = 0, 1, 2, \ldots, h(2m+1) \neq 0 \qquad (4)$$

Accordingly, the order of the FIR filter included in the smoothing block 213 shown in the example configuration of FIG. 3 must be even. In other words, the length of the FIR filter included in the smoothing block 213 must be odd. Note that the smoothing block 213 shown in FIG. 3 may be modified so that it includes a delay 217 included in the feedback path 216. If the smoothing block 213 is modified in this manner, the order of the FIR in the smoothing block 213 must be odd. In other words, the length of the FIR filter in the smoothing block 213 must be even.

The transfer function of the delta-sigma modulator 2 shown in FIG. 3 can be represented by Formula (5) below.

$$Y=(1+Z^{-1}+Z^{-2}+Z^{-3})X+(1+Z^{-1}+Z^{-2}+Z^{-3})(1-Z^{-1})q \quad (5)$$

In the example configuration of FIG. 3, the amplification block 202 is configured to calculate a moving sum of the input signal 101 (X) using a FIR filter. The number of times the amplification block 202 performs addition on the input signal 101 (i.e., the number of taps of the FIR filter in the amplification block 202) is larger by one than the number of times the smoothing block 213 performs addition on the differentiated error signal 212 (i.e., the number of taps of the FIR filter in the smoothing block 213). Owing to this relationship, as shown on the right side of Formula (5), the input signal 201 (X) is given a gain which is equivalent to that given to the quantization error q by a filter factor expressed as $(1+Z^{-1}+Z^{-2}+Z^{-3})$ in Z transform representation. For this reason, the configuration including the amplification block 202 can contribute to suppressing SNR degradation. Note that the amplification block 202 may be omitted or modified for the same reason as that described in the first embodiment.

Figure 4A:
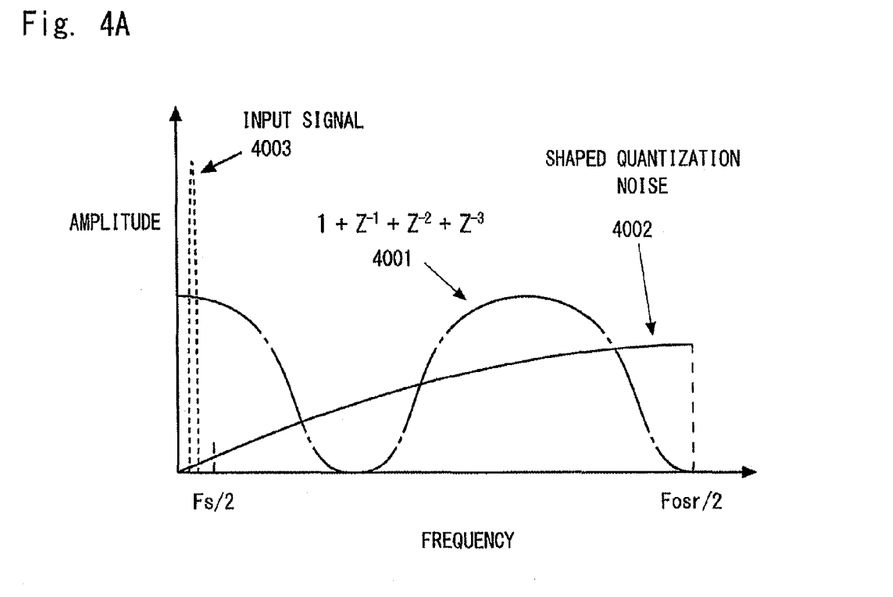
FIG. 4A is a diagram showing noise shaping characteristics, of a, delta-sigma modulator.

Hereafter, effects resulting from the disposition of the smoothing block 213 will be described. A solid line 4002 shown in FIG. 4A is obtained by plotting, as a function of frequency, the quantization error (or quantization noise) that has been noise-shaped by typical first-order delta-sigma modulation shown in FIG. 10A (i.e., $(1-Z^{-1})$ q in Z transform representation). On the other hand, an alternate long and short dashed line 4001 shown in FIG. 4A represents a low-pass filter factor $(1+Z^{-1}+Z^{-2} Z^{-3})$ given to the NTF of the quantization error q by the differentiation block 211, the smoothing block 213 and the feedback path 216 shown in FIG. 3. A dotted line 4003 shown in FIG. 4A represents the spectrum of the input signal.

Figure 4B:
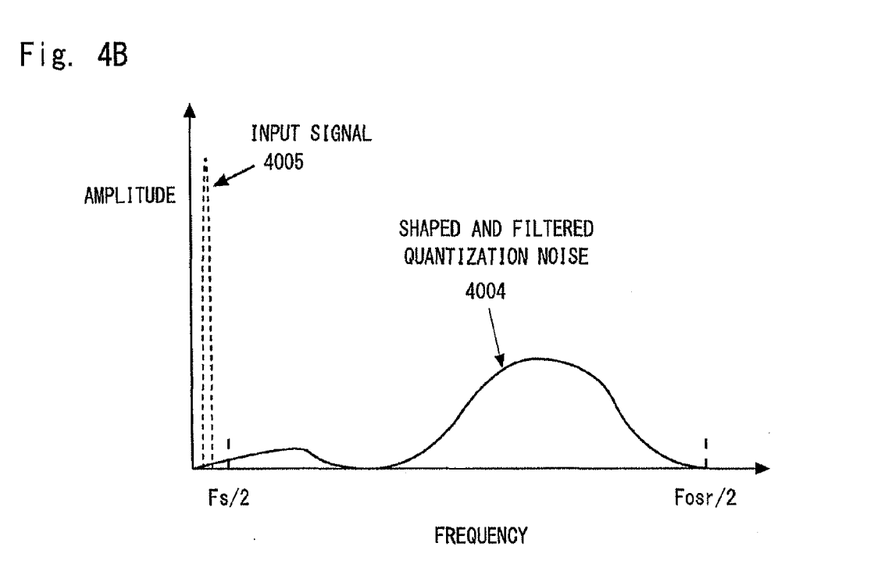
FIG. 4B is a diagram showing an effect of low-pass filtering quantization noise produced by a delta-sigma modulator according to the second embodiment.

FIG. 4B represents the spectrum of the output signal 208 (Y) from the delta-sigma modulator 2. The output signal 208 (Y) includes an input signal component and a quantization error (or quantization noise) component. A solid line 4004 shown in FIG. 4B is obtained by plotting, as a function of frequency, a quantization noise component to which a low-pass filter effect (i.e., $(1+Z^{-1}+Z^{-2}+Z^{-3})$) produced by the differentiation block 211, the smoothing block 213 and the feedback path 216 has been further applied. That is, the solid line 4004 represents a quantization noise component included in the output signal 208 (Y) of the delta-sigma modulator 2 (i.e., the output signal of the quantizer 207). A dotted line 4005 shown in FIG. 4B represents the spectrum of an input signal component included in the output signal 208 (Y) of the delta-sigma modulator 2 (i.e., the output signal of the quantizer 207). As is understood from FIG. 4B, the delta-sigma modulator 2 can suppress the out-of-band quantization noise (in particular, the quantization noise near fosr/2). Specifically, in FIG. 4B, a value of the quantization noise component at half the oversampling frequency fosr (i.e., fosr/2) is smaller than the largest value of the quantization noise component within a frequency band lower than fosr/2 (i.e., 0 or larger and smaller than fosr/2). More specifically, it is ideal that a value of the quantization noise component at fosr/2 in FIG. 4B be zero. However, when the delta-sigma modulator 2 is actually used or evaluated, a value of the quantization noise component at fosr/2 do not necessarily become zero due to such as the effect of external noise caused by an evaluation system device or peripheral device or operation noise caused by other ICs on the chip. Nevertheless, a value of the quantization noise component at half the oversampling frequency fosr (fosr/2) is at least smaller than the largest value of the quantization noise component within a frequency band lower than fosr/2 (i.e., 0 or larger and smaller than fosr/2).

The configuration of the smoothing block 213 shown in FIG. 3 is only illustrative and may be modified as appropriate as long as the condition of Formula (4) is satisfied. Preferably, the configuration of the smoothing block 213 is determined in such a manner that the low-pass filter factor given to the NTF of the quantization error q by the differentiation block 211, the smoothing block 213 and the feedback path 216 has filter characteristics suitable for reducing the out-of-band quantization noise.

A typical delta-sigma DAC is equipped with a low-pass filter (smoothing filter) which is disposed in the subsequent stage of a delta-sigma modulator. In particular, a high-accuracy delta-sigma DAC which is required to have a very high SNR (e.g., SNR>100 dB) in audio applications or the like requires a low-pass filter disposed in the subsequent stage of a delta-sigma modulator. This low-pass filter is preferably embedded in a chip of the delta-sigma DAC. However, actually doing so requires a high-accuracy amplifier and also increases the size of passive components including resistances and capacitances for lowering the cutoff frequency. Accordingly, it is unrealistic to embed this low-pass filter in the chip of the delta-sigma DAC. For this reason, a low-pass filter is often externally attached to the chip of the delta-sigma DAC. In order to relax the conditions such as the cutoff and roll-off conditions to be satisfied by an external low-pass filter or in order to make an external low-pass filter unnecessary, it is preferable to smooth the quantization error in the modulator (i.e., in the chip). As is understood from the NTF shown on the right side of Formula (5), the delta-sigma modulator 2 of the present embodiment can filter the quantization error in the modulator using a low-pass filter factor (i.e., $(1+Z^{-1}+Z^{-2}+Z^{-3})$ in FIG. 3 and Formula (5)). That is, the delta-sigma modulator 2 of the present embodiment can smooth the quantization error in the modulator. Thus, if being used as a delta-sigma DAC, the delta-sigma modulator 2 can relax the conditions such as the cutoff and roll-off conditions to be satisfied by an external low-pass filter.

Third Embodiment

Figure 5:
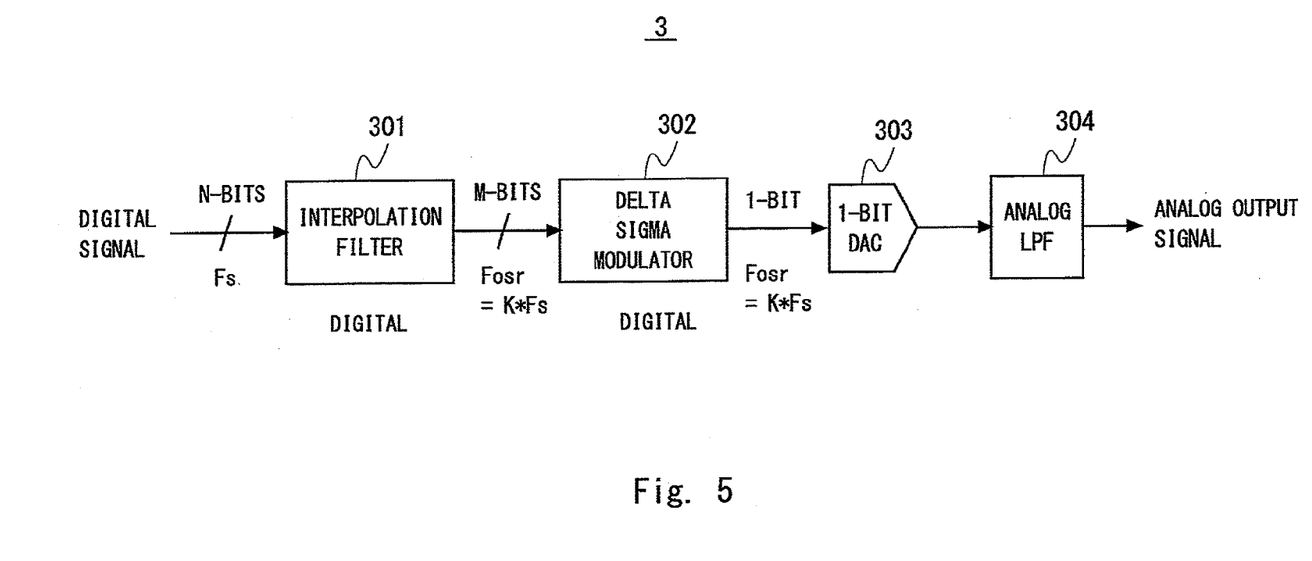
FIG. 5 is a diagram showing an example configuration of a delta-sigma DAC according to a third embodiment.

In the present embodiment, there will be described a delta-sigma DAC equipped with the delta-sigma modulator according to the first or second embodiment. FIG. 5 shows an example configuration of a delta-sigma DAC 3 according to the present embodiment. In the example configuration of FIG. 5, the delta-sigma DAC 3 includes a digital interpolation filter 301, a delta-sigma modulator 302, a 1-bit DAC 303 and an analog low-pass filter (LPF) 304. For example, the digital interpolation filter 301 oversamples an N-bit digital signal having a data rate fs to generate an N-bit digital signal having a data rate fosr=K*fs. As used herein, K represents an oversampling rate. The number of bits (M-bits) of the interpolated (oversampled) digital signal by the digital interpolation filter 301 may be the same as, or larger than, the number of bits (N-bits) of the digital signal before being over-sampled (i.e., M=N or M>N). In contrast, for example, if accuracy is not important, the number of bits (M-bits) of the output signal of the digital interpolation filter 301 may be smaller than the number of bits (N-bits) of the digital signal before being over-sampled (i.e., M<N).

The delta-sigma modulator 302 corresponds to the delta-sigma modulator 1 or 2 according to the first or second embodiment. In the example of FIG. 5, the delta-sigma modulator 302 includes a 1-bit quantizer (quantizer 107 or 207). Accordingly, the output of the delta-sigma modulator 302 is a 1-bit signal.

The 1-bit DAC 303 converts the 1-bit signal outputted from the delta-sigma modulator 302 into an analog signal. The analog LPF 304 averages (smoothes) the analog output of the 1-bit DAC 303 and eliminates the out-of-band quantization noise. The analog LPF 304 may be disposed outside a semi-conductor chip (i.e., mixed-signal integrated circuit (IC)) including the digital interpolation filter 301, the delta-sigma modulator 302 and the 1-bit DAC 303.

Use of the delta-sigma modulator 1 or 2 according to the first or second embodiment as the delta-sigma modulator 302 prevents an increase in the bit number of the output signal of the delta-sigma modulator 302. Accordingly, the delta-sigma DAC 3 of the present embodiment only has to use a single 1-bit DAC 303 and does not require multiple 1-bit DACs 303. As a result, the delta-sigma DAC 3 does not require a dynamic element matching (DEM) circuit for reducing mismatch between multiple DACs. Further, the delta-sigma DAC 3 does not require the AFIR filter DACs described in Hezar et al. and U.S. Patent Application Publication No. 2011/0043398.

Use of the delta-sigma modulator 1 or 2 as the delta-sigma modulator 302 also allows smoothing of the quantization error in the delta-sigma modulator 302. Thus, the delta-sigma DAC 3 of the present embodiment can relax the conditions such as the cutoff and roll-off conditions to be satisfied by the analog LPF 304.

Fourth Embodiment

Figure 6:
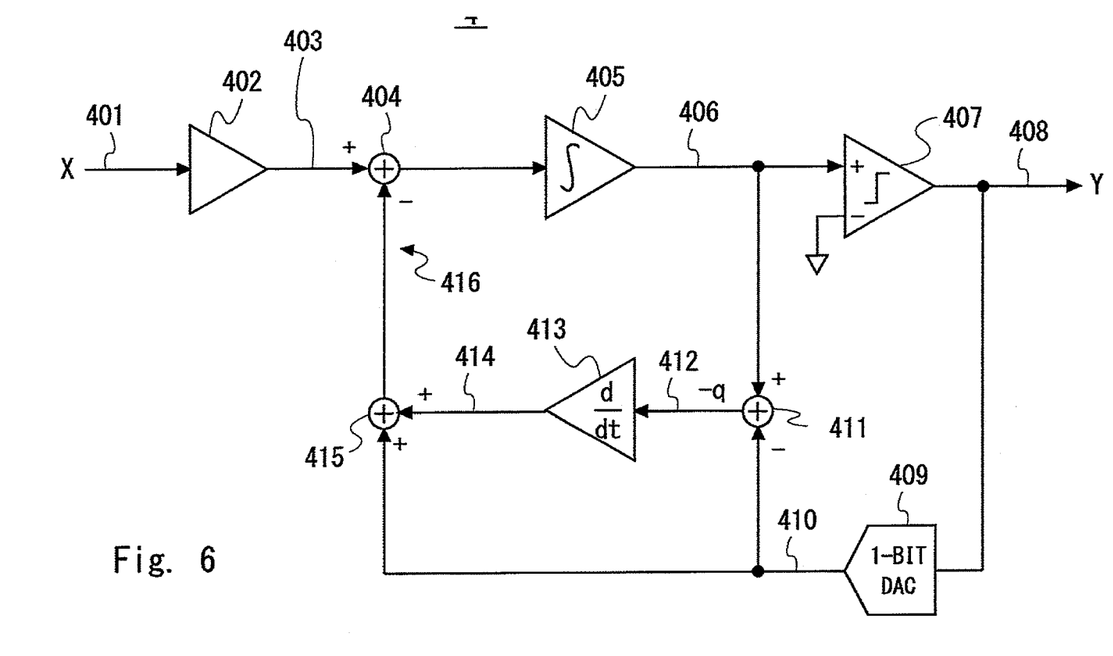
FIG. 6 is a diagram showing an example configuration of a delta-sigma modulator, used for a delta-sigma ADC, according to a fourth embodiment.

In the present embodiment, there will be described modifications of the delta-sigma modulators 1 and 2 according to the first and second embodiment. The delta-sigma modulators 1 and 2 may be used for delta-sigma ADCs. In the present embodiment, there will be described example configurations of the delta-sigma modulator 1 and 2 used in delta-sigma ADCs. FIG. 6 shows an example configuration of a delta-sigma modulator 4 according to the present embodiment. The example shown in FIG. 6 is a modification of the delta-sigma modulator 1 shown in FIG. 1 or 2. An analog amplifier 402 corresponds to the amplification block 102 and amplifies the amplitude of an input signal 401. The analog amplifier 402 may include an analog FIR filter. The analog amplifier 402 may be omitted.

An adder 404 subtracts a feedback signal provided by a feedback path 416 from a signal 403. The adder 404 may include an inverter circuit and a node. An analog integrator 405 integrates a signal from the adder 404. A comparator 407 serving as a quantizer quantizes an integrated signal 406 generated by the analog integrator 405. Here assume that the comparator 407 is a 1-bit comparator. Accordingly, an output signal 408 of the comparator 407 is a 1-bit signal (i.e., serial bit stream).

A 1-bit DAC 409 is disposed in the feedback path 416. In order to provide the output signal 408 of the comparator 407 to the input of the analog integrator 405, the 1-bit DAC 409 converts the output signal 408 into an analog signal 410.

An adder 411 generates a signal 412 (i.e., −q) where the sign of the quantization error q is inverted, by subtracting the analog output signal 410 from the integrated signal 406 generated by the analog integrator 405. An analog differentiator 413 serving as a differentiation block generates a differentiated error signal 414 by differentiating the signal 412. The differentiated error signal 414 is combined with the feedback signal (i.e., the analog output signal 410 from the 1-bit DAC 409) by an adder 415 and then provided to the input of the analog integrator 405 through the feedback path 416 and the adder 404.

The delta-sigma modulator 4 according to the present embodiment employs the configuration where the differentiated error signal 414 is provided to the input of the analog integrator 405. Thus, the delta-sigma modulator 4 can filter the quantization error q in the feedback loop thereof using a low-pass filter factor $(1+Z^{-1})$, thereby reducing the out-of-band quantization noise (in particular, the quantization noise near fosr/2). As a result, the delta-sigma modulator 4 can suppress the degradation of noise characteristics caused when the out-of-band quantization noise is folded back into the frequency band of interest. Further, there is no need to dispose multiple 1-bit DACs 409 in the feedback path 416 of the delta-sigma modulator 4.

The case where the delta-sigma modulator 1 according to the first embodiment is used in a delta-sigma ADC has been mainly described in the present embodiment with reference to FIG. 6. Of course, the delta-sigma modulator 2 according to the second embodiment can also be used in a delta-sigma ADC. Those skilled in the art who have known the disclosed specification will easily appreciate that it is possible to use the delta-sigma modulator 2 in a delta-sigma ADC by properly disposing a DAC in the feedback path 216 of the delta-sigma modulator 2.

Fifth Embodiment

Figure 7:
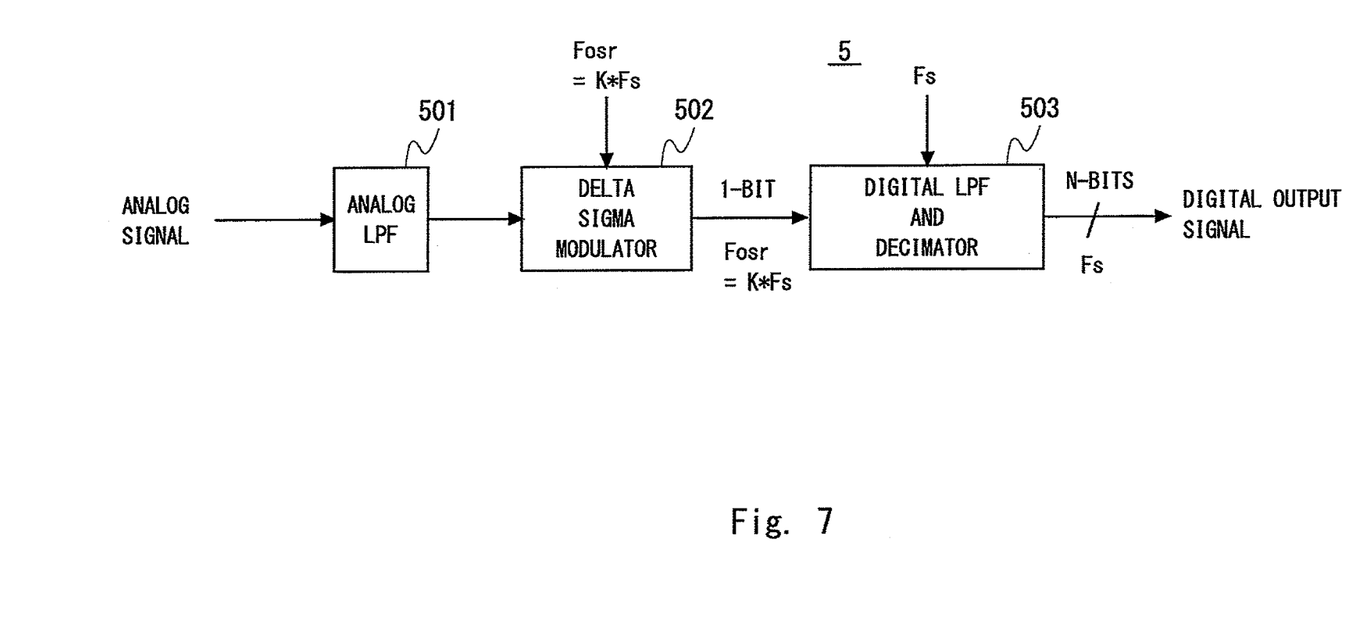
FIG. 7 is a diagram showing an example configuration of a delta-sigma ADC according to a fifth embodiment.

In the present embodiment, there will be described a delta-sigma ADC equipped with the delta-sigma modulator according to the first, second, or fourth embodiment. FIG. 7 shows an example configuration of a delta-sigma ADC 5 according to the present embodiment. In the example configuration of FIG. 7, a delta-sigma ADC 5 includes an analog LPF 501, a delta-sigma modulator 502 and a digital filter 503. The analog LPF 501 is disposed in the preceding stage of the delta-sigma modulator 502 and suppresses folding noise (an aliasing). That is, the analog LPF 501 is an antialiasing filter.

The delta-sigma modulator 502 corresponds to the delta-sigma modulator 1, 2, or 4 according to the first, second, or fourth embodiment. In the example of FIG. 7, the delta-sigma modulator 502 includes a 1-bit quantizer (quantizer 107, quantizer 207, or comparator 407). Accordingly, an output of the delta-sigma modulator 502 is a 1-bit signal having a data rate fosr=K*fs. As used herein, K represents an oversampling rate.

The digital filter 503 performs a digital LPF process to attenuate the out-of-band quantization noise included in the output signal of the delta-sigma modulator 502 and a decimation process to reduce the data rate of the output signal of the delta-sigma modulator 502. In other words, the digital filter 503 includes a digital LPF and a decimator filter. An output signal from the digital filter 503 is a multi-bit signal having a data rate fs.

Sixth Embodiment

Figure 8:
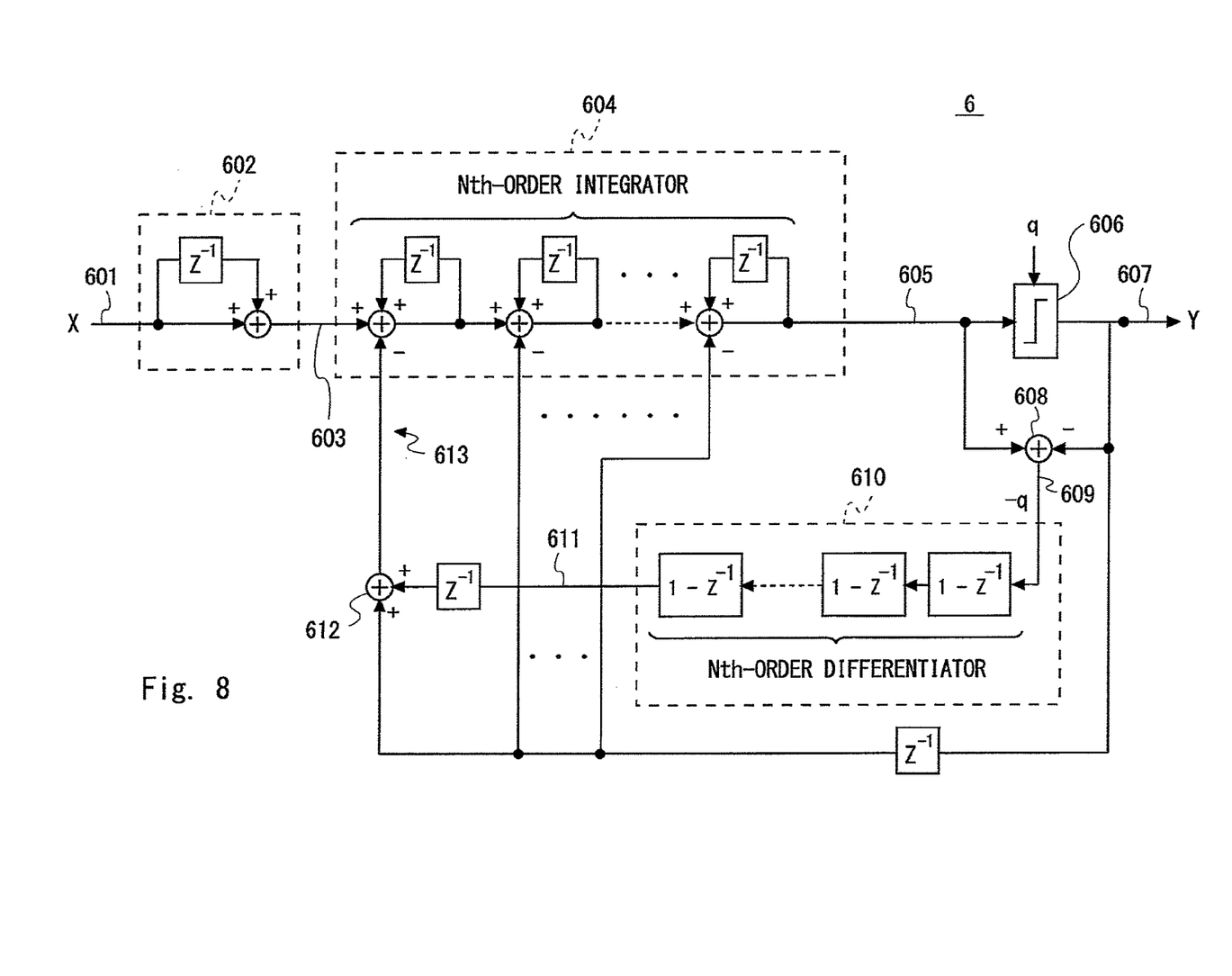
FIG. 8 is a diagram showing an example configuration of a delta-sigma modulator according to a sixth embodiment.

In the first to fifth embodiments, a first-order delta-sigma modulator has been used as an example for the sake of convenience. However, the technical idea, including the feedback of differentiated error signal to the input of the integrator, described in the first to fifth embodiments is also applicable to second- and higher-order delta-sigma modulators. FIG. 8 shows an n-th order delta-sigma modulator 6 according to the present embodiment. The n-th order delta-sigma modulator 6 shown in FIG. 8 is obtained by generalizing the first-order delta-sigma modulator 1 shown in FIG. 2 to an n-th order. As used herein, n is an integer greater than or equal to 1. Note that the case where n=1 has been described in the first to fifth embodiments. That is, when n=1 in FIG. 8, the delta-sigma modulator 6 is substantially the same as the first-order delta-sigma modulator 1 shown in FIG. 2.

An integrator 604 performs n-th order integration of an input signal 603. For example, as shown in FIG. 8, the integrator 604 includes n number of cascaded integration stages.

A differentiation block 610 performs n-th order differentiation of the quantization error q. For example, as shown in FIG. 8, the differentiation block 610 includes n number of cascaded differentiation stages. Accordingly, a differentiated error signal 611 generated by the differentiation block 610 represents the n-th order derivative of the quantization error q.

The configuration and operation of an amplification block 602, a quantizer 606, an adder 608, an adder 612 and a feedback path 613 may be substantially the same as those of the amplification block 102, the adder 104, the quantizer 107, the adder 109, the adder 113 and the feedback path 114 shown in FIG. 1 or 2. In short, the amplification block 602 amplifies the amplitude of an input signal 601 (X) of the delta-sigma modulator 6. The amplification block 602 may be omitted. The quantizer 606 quantizes an integrated signal 605 generated by the integrator 604.

The adder 608 generates a signal (−q) where the sign of the quantization error q is inverted, by subtracting an output signal 607 (Y) of the quantizer 606 from the integrated signal 605 generated by the integrator 604. The adder 612 combines a differentiated error signal 611 generated by the differentiation block 610 and a feedback signal (i.e., an output signal 607 (Y) of the delta-sigma modulator 6). The feedback path 613 provides the feedback signal including the output signal 607 (Y) of the delta-sigma modulator 6 and the differentiated error signal 611 to the input of the integrator 604.

What should be noted here is that the differentiated error signal 611 representing the n-th order derivative of the quantization error is fed back only to the first integration stage of the n number of cascaded integration stages included in the integrator 604. In other words, only a feedback signal to be provided to the first integration stage, of n number of feedback signals each to be provided to a corresponding one of the n number of integration stages, is generated from the differentiated error signal 611.

The relationship between the output signal 607 (Y) and input signal 701 (X) of the delta-sigma modulator 6 shown in FIG. 8 is mathematically represented by Formula (6) below.

$$W=(1+Z^{-1})X+(1+Z^{-1})(1-Z^{-1})^n q \qquad (6)$$

The delta-sigma modulator 6 shown in FIG. 8 calculates the n-th order derivative of the quantization error in the differentiation block 610. The order of derivative is the same as the order (n) of the integrator 604, which determines the order (n) of noise shaping of the quantization error (or quantization noise). Accordingly, the delta-sigma modulator 6 feeds back the output signal 607 of the quantizer 606 to each of the n number of integration stages in the integrator 604. The delta-sigma modulator 6 also feeds back the differentiated error signal 611 representing the n-th order derivative of the quantization error only to, the first integration stage of the n number of integration stages included in the integrator 604. Owing to this configuration, the delta-sigma modulator 6 can filter the quantization error q using a low-pass filter factor $(1+Z^{-1})$ as shown in Formula (6), thereby reducing the out-of-band quantization noise (in particular, the quantization noise near fosr/2).

Further, the delta-sigma modulator 6 achieves the improved NTF, i.e., $(1+Z^{-1})(1-Z^{-1})$ through the calculation in the feedback loop thereof. This prevents an increase in the bit number of the output signal 607 (Y) of the delta-sigma modulator 6. For this reason, the delta-sigma modulator 6 can solve some problems associated with the configuration including the moving sum block 907 shown in FIG. 9, for example, an increase in the bit number of the modulator output, an increase in the number of DACs to be disposed at outputs of the modulator, and an increase in the number of feedback DACs.

The above-described embodiments can be combined as appropriate or desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A delta-sigma modulator comprising:
   an integration block configured to generate an integrated signal by integrating a signal including a first signal and a feedback signal;
   a quantization block configured to generate an output signal by quantizing the integrated signal;
   a differentiation block configured to generate a differentiated error signal representing derivative of quantization error caused by the quantization block; and
   a feedback path configured to provide the feedback signal including the output signal and the differentiated error signal to the integration block.

2. The delta-sigma modulator according to claim 1, wherein the feedback signal represents a signal obtained by adding the differentiated error signal to the output signal or a signal obtained by subtracting the differentiated error signal from the output signal.

3. The delta-sigma modulator according to claim 1, further comprising a smoothing block coupled to the feedback path and configured to smooth the differentiated error signal, wherein
   the feedback signal represents a signal obtained by adding the smoothed differentiated error signal to the output signal or a signal obtained by subtracting the smoothed differentiated error signal from the output signal.

4. The delta-sigma modulator according to claim 3, wherein the smoothing block calculates a moving sum or moving average of the differentiated error signal.

5. The delta-sigma modulator according to claim 1, wherein
   the integration block includes n number of integration stages, n being an integer greater than or equal to 1, and
   the differentiated error signal represents n-th order derivative of the quantization error.

6. The delta-sigma modulator according to claim 5, wherein the differentiation block includes n number of differentiation stages.

7. The delta-sigma modulator according to claim 5,
   wherein the feedback signal includes n number of feedback signals each to be provided to a corresponding one of the n number of integration stages, and
   wherein only a first feedback signal, out of the n number of feedback signals, to be provided to a first integration stage of the n number of integration stages is generated from the differentiated error signal.

8. The delta-sigma modulator according to claim 1, further comprising an amplification block configured to amplify an input signal to generate the first signal.

9. The delta-sigma modulator according to claim 8, wherein the first signal represents a moving sum of the input signal.

10. A delta-sigma modulator comprising:
an integration block;
a quantization block coupled to the integration block and configured to generate an output signal of the delta-sigma modulator; and
a feedback path configured to provide, to the integration block, the output signal and a differentiated error signal representing derivative of quantization error caused by the quantization block.

11. The delta-sigma modulator according to claim 10, further comprising a smoothing block coupled to the feedback path and configured to smooth the differentiated error signal, wherein
the feedback path provides the smoothed differentiated error signal to the integration block.

12. The delta-sigma modulator according to claim 10, wherein
the integration block includes n number of integration stages, n being an integer greater than or equal to 10, and
the differentiated error signal represents n-th order derivative of the quantization error.

13. The delta-sigma modulator according to claim 12, wherein the feedback signal provided to the integration block by the feedback path includes n number of feedback signals each to be provided to a corresponding one of the n number of integration stages, and
wherein only a first feedback signal to be provided to a first integration stage of the n number of integration stages is generated from the differentiated error signal.

14. The delta-sigma modulator according to claim 10, further comprising an amplification block configured to generate a first signal to be provided to the integration block by amplifying an input signal to the delta-sigma modulator.

15. The delta-sigma modulator according to claim 14, wherein the first signal represents a moving sum of the input signal.

16. A delta-sigma digital-to-analog converter comprising;
the delta-sigma modulator according to claim 1;
a digital-to-analog converter coupled to an output of the delta-sigma modulator; and
an analog low-pass filter coupled to an output of the digital-to-analog converter.

17. A delta-sigma analog-to-digital converter comprising:
the delta-sigma modulator according to claim 1; and
a digital filter coupled to an output of the delta-sigma modulator.

18. A delta-sigma modulator operating at an oversampling frequency fosr, comprising a quantization block,
Wherein, in characteristics obtained by plotting an output signal of the quantization block as a function of frequency, a value of quantization error component included in the output signal at half the oversampling frequency fosr (fosr/2) is smaller than the largest value of quantization error component included in the output signal within a frequency band lower than fosr/2.

19. A delta-sigma digital-to-analog converter comprising:
the delta-sigma modulator according to claim 18;
a digital-to-analog converter coupled to an output of the delta-sigma modulator; and
an analog low-pass filter coupled to an output of the digital-to-analog converter.

20. A delta-sigma analog-to-digital converter comprising:
the delta-sigma modulator according to claim 18; and
a digital filter coupled to an output of the delta-sigma modulator.

* * * * *